US008944150B2

(12) United States Patent
Wang

(10) Patent No.: US 8,944,150 B2
(45) Date of Patent: Feb. 3, 2015

(54) DISSIPATION UTILIZING FLOW OF REFRIGERANT

(75) Inventor: Hao Wang, Haidian District (CN)

(73) Assignee: Empire Technology Development LLC, Wilmington, DE (US)

( * ) Notice: Subject to any disclaimer, the term of this patent is extended or adjusted under 35 U.S.C. 154(b) by 1260 days.

(21) Appl. No.: 12/535,530

(22) Filed: Aug. 4, 2009

(65) Prior Publication Data

US 2010/0025015 A1    Feb. 4, 2010

(30) Foreign Application Priority Data

Aug. 4, 2008    (CN) .......................... 2008 1 0041372

(51) Int. Cl.
| F28D 15/02 | (2006.01) |
| H01L 23/427 | (2006.01) |
| F28D 15/04 | (2006.01) |
| F28F 13/00 | (2006.01) |
| H05K 7/20 | (2006.01) |

(52) U.S. Cl.
CPC .............. H01L 23/427 (2013.01); F28D 15/02 (2013.01); F28D 15/046 (2013.01); F28F 13/00 (2013.01)
USPC ............. 165/85; 165/80.1; 165/80.4; 165/94; 165/95; 165/104.25; 165/104.33; 165/109.1; 361/699; 361/700; 257/714; 257/715

(58) Field of Classification Search
CPC ..... F28D 15/02; F28D 15/046; H01L 23/427; F28F 13/00
USPC .............. 165/109.1, 94, 95, 85, 104.33, 80.4, 165/80.1, 104.25; 361/699, 700; 257/714, 257/715
See application file for complete search history.

(56) References Cited

U.S. PATENT DOCUMENTS

| 3,764,483 | A |   | 10/1973 | Tleimat |
| 4,094,170 | A |   | 6/1978 | Kantor |
| 4,832,114 | A | * | 5/1989 | Yeh .................................. 165/85 |
| 4,966,226 | A |   | 10/1990 | Hamburgen |
| 5,297,623 | A | * | 3/1994 | Ogushi et al. ................. 165/121 |
| 5,409,576 | A |   | 4/1995 | Tleimat |
| 5,441,102 | A | * | 8/1995 | Burward-Hoy .......... 165/104.25 |
| 5,878,808 | A |   | 3/1999 | Rock et al. |
| 6,408,937 | B1 | * | 6/2002 | Roy .......................... 165/104.33 |
| 6,668,911 | B2 |   | 12/2003 | Bingler |
| 6,839,234 | B2 |   | 1/2005 | Niwatsukino et al. |
| 7,055,581 | B1 |   | 6/2006 | Roy |
| 7,224,585 | B2 |   | 5/2007 | Lee et al. |
| 7,262,967 | B2 | * | 8/2007 | Crocker et al. ............... 361/699 |

(Continued)

FOREIGN PATENT DOCUMENTS

JP    2007064532 A    3/2007

*Primary Examiner* — John Ford
(74) *Attorney, Agent, or Firm* — Brundidge & Stanger, P.C.

(57) ABSTRACT

A heat dissipating device includes a chamber with an evaporation portion and a condensation portion, the chamber including a refrigerant. The chamber further includes an evaporation portion scraping brush provided corresponding to the evaporation portion, the evaporation portion scraping brush being able to sweep relative to an inner surface of the evaporation portion. A refrigerant liquid film is formed on the inner surface of the evaporation portion. Since the fluid refrigerant is uniformly applied to an inner surface of the evaporation portion to form a liquid film, the heat dissipating ability of the heat pipe heat dissipating device is improved, and the heat dissipating uniformity of the heat pipe heat dissipating device is enhanced. A heat dissipating method is also provided.

10 Claims, 4 Drawing Sheets

(56) References Cited

U.S. PATENT DOCUMENTS

| | | |
|---|---|---|
| 7,424,906 B2 * | 9/2008 | Bhatti et al. ............ 165/104.33 |
| 7,438,120 B2 | 10/2008 | Hong et al. |
| 7,481,263 B2 | 1/2009 | Breier et al. |
| 7,980,078 B2 * | 7/2011 | McCutchen et al. ............ 60/645 |
| 2002/0101717 A1 | 8/2002 | Lin |
| 2003/0213585 A1 | 11/2003 | Reznik |
| 2004/0052049 A1 | 3/2004 | Wu et al. |
| 2005/0024830 A1 * | 2/2005 | Lee et al. ................... 361/699 |
| 2008/0142195 A1 | 6/2008 | Erturk et al. |

\* cited by examiner a  b

DISSIPATION UTILIZING FLOW OF REFRIGERANT

CROSS-REFERENCE TO RELATED APPLICATION

The present invention is related to U.S. application Ser. No. 12/535,542 filed Aug. 4, 2009, the entire content of which is incorporated herein by reference.

BACKGROUND

With the progress of super-large scale integrated circuit manufacturing technology, the size of a chip is becoming smaller and smaller, while the heat-emitting power is becoming higher and higher, thus increasing the flux of heat dissipation from the chip.

According to the principles of thermodynamics, the heat conductivity of a fluid is larger than that of air. Based on this theory, pipe heat dissipating technologies such as water cooling have been gradually applied to high power electronic components, e.g. CPU and GPU. However, all these heat dissipating technologies have various limitations.

SUMMARY

An example embodiment of a heat dissipating device includes a chamber having a first portion and a second portion; and a first brush positioned adjacent to an inner surface of the first portion, the first brush is configured to sweep the inner surface of the first portion.

An example embodiment of a heat dissipating method includes forming a refrigerant liquid film on an inner surface of a first portion of a chamber; heating the refrigerant liquid film; forming a refrigerant vapor from the refrigerant liquid film; and condensing the refrigerant vapor on an inner surface of a second portion of a chamber.

The foregoing is a summary and thus contains, by necessity, simplifications, generalization, and omissions of detail; consequently, those skilled in the art will appreciate that the summary is illustrative only and is not intended to be in any way limiting. Other aspects, features, and advantages of the devices and/or processes and/or other subject matter described herein will become apparent in the teachings set forth herein. The summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

With reference to the accompanying drawings, a detailed description will be given to the structure of example embodiments of the heat dissipating device and the steps of an example embodiment of the heat dissipating method, in which a semiconductor chip is taken as an example of the heat emitting object, and can be any heat emitting object.

The present disclosure is drawn to, inter alia, methods, systems and devices for providing heat dissipation. The device includes a chamber having a first portion and a second portion; and a first brush positioned adjacent to an inner surface of the first portion, the first brush is configured to sweep the inner surface of the first portion.

An example embodiment of a heat dissipating method includes forming a refrigerant liquid film on an inner surface of a first portion of a chamber; heating the refrigerant liquid film; forming a refrigerant vapor from the refrigerant liquid film; and condensing the refrigerant vapor on an inner surface of a second portion of a chamber.

In the above example embodiment, the fluid refrigerant is uniformly applied to an inner surface of the evaporation portion to form a liquid film so that the heat dissipating ability of the heat pipe heat dissipating device is improved. In addition, the uniform application of the fluid refrigerant to the inner surface of the evaporation portion enhances the heat dissipating uniformity of the heat pipe heat dissipating device.

Figure 1:
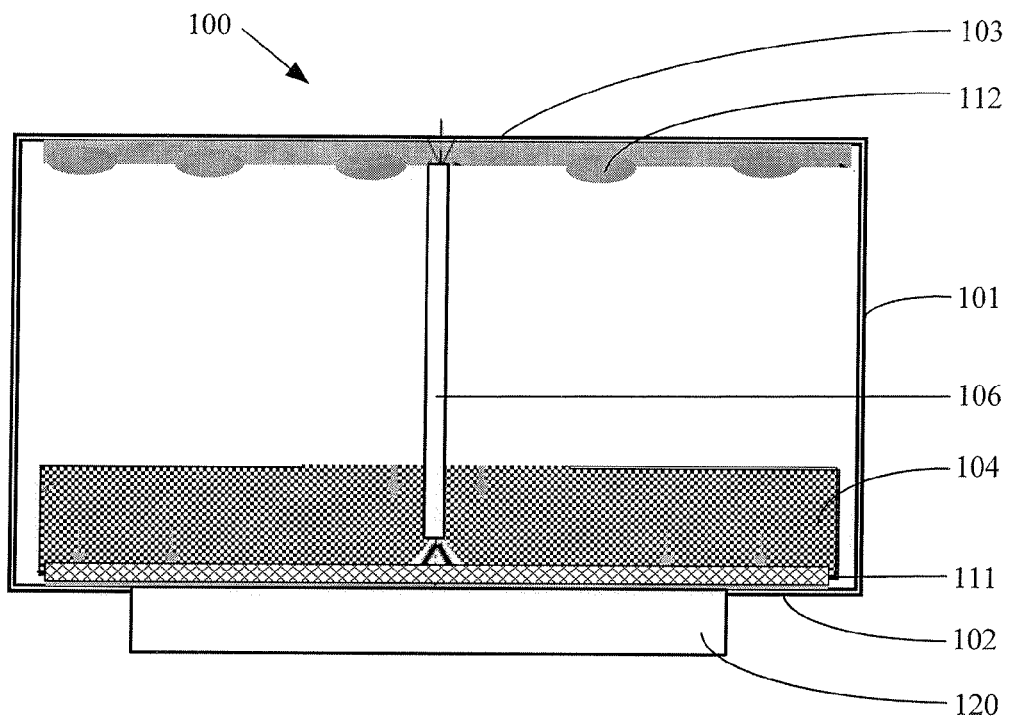
FIG. 1 is a schematic sectional front view of one example embodiment of the heat dissipating device of the present disclosure.

FIG. 1 illustrates a sectional front view of one example embodiment of the heat dissipating device of the present disclosure. As shown in FIG. 1, the heat dissipating device 100 includes a chamber 101 such as a housing. The chamber 101 is an enclosed or substantially enclosed hollow body which is able to at least isolate the gas transfer between the inside of the chamber 101 and the environment. The exterior of the chamber 101 may be formed in a common shape, such as a column, can be a multi-faced cube, for example, a square cube, a rectangle, rhomboid, etc. Accordingly, the hollow portion of the chamber 101 may be formed in, for example, a column, can be a multi-faced cube, for example, a square cube, a rectangle, rhomboid, etc. The chamber 101, for example a housing, is usually made of a material with good thermal conductivity such as metal.

A refrigerant is contained inside the chamber 101. The charging amount of the refrigerant can be determined according to the working temperature and heat dissipating power of the heat dissipating device 100, as well as the properties of the refrigerant itself. The refrigerant may be water, ammonia methanol, etc.

One or more side walls of the chamber 101 may be implemented as an evaporation portion 102. Evaporation portion 102 may be configured to be in contact with the heat generating unit 120, for example an electronic circuit or a semiconductor chip. One or more side walls of the chamber 101 may be implemented as a condensation portion 103. Condensation portion 103 may be configured to be in contact with an auxiliary heat dissipating device (not shown). The heat emitted by the heat generating unit 120 is transferred to the refrigerant inside the chamber 101 through the evaporation portion 102. The refrigerant evaporates on an inner surface of the evaporation portion 102 and absorbs the heat transferred from the evaporation portion 102. The refrigerant forms a refrigerant vapor after absorbing heat. The refrigerant vapor reaches an inner surface of the condensation portion 103 by dispersion, releases heat to coagulate on the inner surface of the condensation portion 103 and forms a fluid refrigerant. The heat transfer from the evaporation portion to the condensation portion is thereby accomplished. In other example embodiments, an auxiliary heat dissipating device (not shown) such as air cooling, water cooling or fins can be installed to the outer surface of the condensation portion 103 to accelerate the heat transfer from the condensation portion to the outside.

The chamber 101 further includes therein an evaporation portion scraping brush 104 which is provided corresponding to the evaporation portion 102. The evaporation portion scraping brush 104 can sweep across the inner surface of the evaporation portion 102. By this sweeping motion, the fluid refrigerant on the evaporation portion scraping brush 104 is uniformly applied to the inner surface of the evaporation portion 102, thus forming a refrigerant liquid film 111 on the inner surface of the evaporation portion 102. Hence, the heat transferred from the heat generating unit 120 to the evaporation portion 102 is uniformly absorbed so that the heat dissipating uniformity of the heat pipe heat dissipating device 100 is improved.

Figure 2:
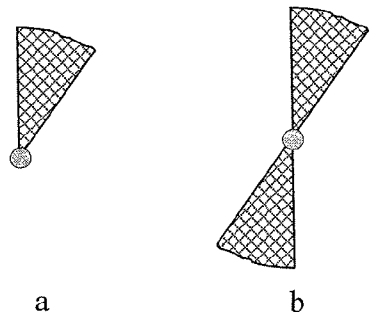
FIGS. 2a and 2b are schematic views of the shapes of two example embodiments of the scraping brush, respectively.

The evaporation portion scraping brush 104 can be of an elongated shape, can be a single sector shape as shown in FIG. 2a, can be a symmetrical sector shape as shown in FIG. 2b, etc. The surface of the evaporation portion scraping brush 104 which is opposed to the evaporation portion 102 is in contact with the inner surface of the evaporation portion 102. During the sweeping motion of the evaporation portion scraping brush 104, the surface of the evaporation portion scraping brush 104 is still in contact with the evaporation portion 102. Alternatively, the surface of the evaporation portion scraping brush 104 which is opposed to the evaporation portion 102 is kept a distance from the inner surface of the evaporation portion 102. During the sweeping motion of the evaporation portion scraping brush 104, the surface of the evaporation portion scraping brush 104 is still kept a distance from the evaporation portion 102.

In an example embodiment, a relatively thinner liquid film 111 is formed on the inner surface of the evaporation portion 102 such that the heat flux of the refrigerant absorbing heat from the surface of the evaporation portion 102 to evaporate is $$q'' = \frac{2\lambda\Delta T}{\delta_0 + \delta'} \quad (1)$$

Figure 3:
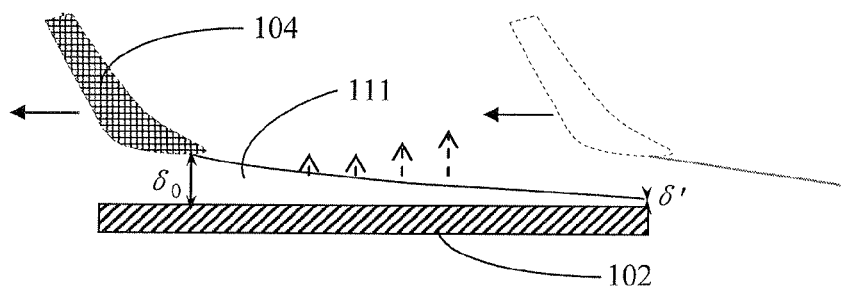
FIG. 3 is a schematic principle view of one example embodiment of the heat dissipating device.

Wherein, $\lambda$ is the heat conductivity of the refrigerant. $\Delta T$ is the superheat of the evaporation portion 102 over the environment. As shown in FIG. 3, $\delta_0$ is the initial thickness of the liquid film 111. $\delta'$ is the evaporation final thickness of the liquid film 111, that is, the thickness at which the liquid film 111 does not continue to evaporate at the overheat temperature due to the action forces between molecules. The thickness $\delta'$ is substantially at the order of $10^{-9}$ m. However, to improve the reliability of equation (1), the thickness $\delta'$ can be set at the order of $10^{-7}$ m. From equation (1), $\delta_0+\delta'$ represents the heat transfer resistance of the liquid film, in the case that the evaporation final thickness $\delta'$ of the liquid film 111 is constant, the smaller the initial thickness $\delta_0$ of the liquid film 111 is, the higher the heat flux of the refrigerant absorbing heat from the surface of the evaporation portion 102 to evaporate is, i.e. the stronger the heat dissipating ability of the heat pipe heat dissipating device 100 is. When the initial thickness $\delta_0$ of the liquid film 111 is 10 μm and $\Delta T$ is 10°, the heat flux q" can reach 200 W/cm². When the initial thickness $\delta_0$ of the liquid film 111 is 1 μm and $\Delta T$ is 10°, the heat flux q" can reach 800 W/cm². Accordingly, the heat dissipating capability of the heat dissipating device 100 can be improved by uniformly applying the fluid refrigerant to the inner surface of the evaporation portion 102 by the evaporation portion scraping brush 104 to form a refrigerant liquid film 111 thereon.

Furthermore, in order to avoid the situation from occurring such that the liquid film 111 cannot take away any more heat from the evaporation portion 102 after reaching the evaporation final thickness $\delta'$ when a period of time has elapsed, the evaporation portion scraping brush 104 can sweep across the inner surface of the evaporation portion 102 periodically to make sure that there is a liquid film 111 that can be evaporated on the inner surface of the evaporation portion 102. The period is determined by the following equation:

$$t' = \frac{(\delta_0^2 - \delta'^2)\rho h_{fg}}{2\lambda\Delta T} \quad (2)$$

Wherein, t' is the period, $\delta_0$ is the initial thickness of the liquid film 111, $\delta'$ is the evaporation final thickness of the liquid film 111, $\rho$ is the density of the refrigerant, $h_{fg}$ is the potential energy of the refrigerant, $\lambda$ is the heat conductivity of refrigerant, and $\Delta T$ is the superheat of the evaporation portion over the environment.

Figure 4:
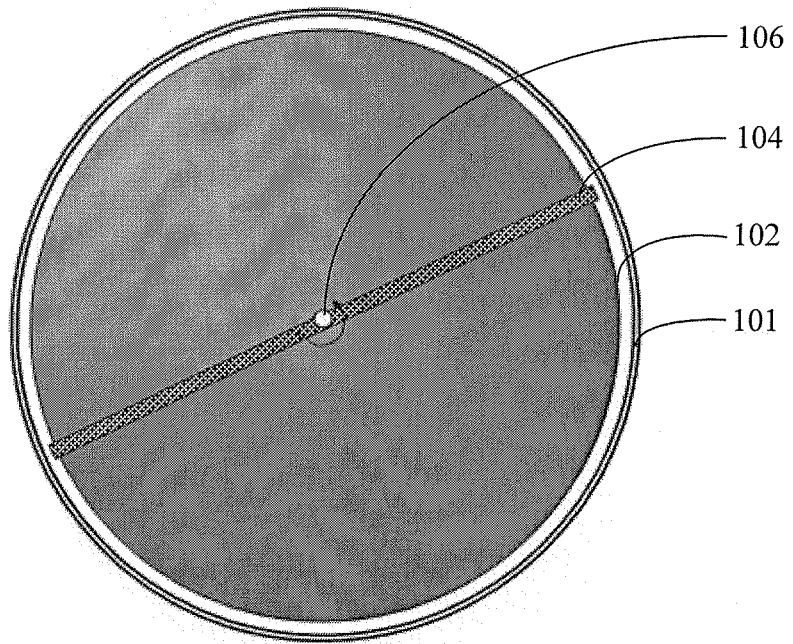
FIG. 4 is a schematic sectional top view of another example embodiment of the heat dissipating device.

In one example embodiment, the structure as shown in FIGS. 1 and 4 is adopted wherein the evaporation portion scraping brush 104 can sweep across the inner surface of the evaporation portion 102 periodically. Inside the chamber 101, there is further provided a rotary shaft 106 which is perpendicular or substantially perpendicular to the inner surface of the evaporation portion 102. The evaporation portion scraping brush 104 is fixed to an end of the rotary shaft 106 which is adjacent to the evaporation portion 102. The rotary shaft 106 drives the evaporation portion scraping brush 104 to rotate at a given speed such that the evaporation portion scraping brush 104 sweeps across the inner surface of the evaporation portion 102 periodically. In this case, the chamber 101 can be formed as a column shape with the rotary shaft 106 as a rotation axis. If the inner surface of the evaporation portion 102 is not a plane but a surface of a rotor such as a hemisphere surface, a conical surface or a truncated cone surface, the evaporation portion scraping brush 104 can be formed as an arc shape, a ∧ profile or a ⌐ profile, and the rotary shaft 106 is co-linear with the axis of above rotor. The rotary shaft 106 can be driven by external forces, e.g., the rotary shaft 106 can extend out of the chamber 101 adjacent to an end of the condensation portion 103 and is driven to rotate by a driving device, for example, an electrical motor (not shown).

In the example embodiment shown in FIG. 4, the rotary shaft 106 is disposed at the center of the evaporation portion scraping brush 104. The same portion of the inner surface the evaporation portion 102 will be swept twice by the evaporation portion scraping brush 104 after one revolution of the rotary shaft 106. In other example embodiments, the rotary shaft 106 can be disposed on a side of the evaporation portion scraping brush 104.

The rotational speed of the rotary shaft 106 is determined by the following equation:

$$\omega = \frac{4\pi\lambda\Delta T}{(\delta_0^2 - \delta'^2)\rho h_{fg} N} \quad (3)$$

wherein, N is the number of times that the same portion of the inner surface of the evaporation portion 102 is swept by the evaporation portion scraping brush 104 after one revolution of the rotary shaft 106, and the other variables have the same definition as the corresponding variables in equation (1), (2) and (3).

In an example embodiment, the relationship between the heat flux of refrigerant absorbing heat from the inner surface of the evaporation portion 102 to evaporate and the rotational speed ω of the rotary shaft 106 is:

$$q'' = \frac{(\delta_0 + \delta')\rho h_{fg} \omega N}{2\pi} \quad (4)$$

The variables in this equation have the same definition as the corresponding variables in equation (1), (2) and (3). According to equation (4), the heat flux of refrigerant absorbing heat from the inner surface of the evaporation portion 102 to evaporate is in direct proportion to the rotary speed c of the rotary shaft 106. Therefore the heat dissipating ability of the heat dissipating device is controlled by controlling the rotational speed.

Figure 5:
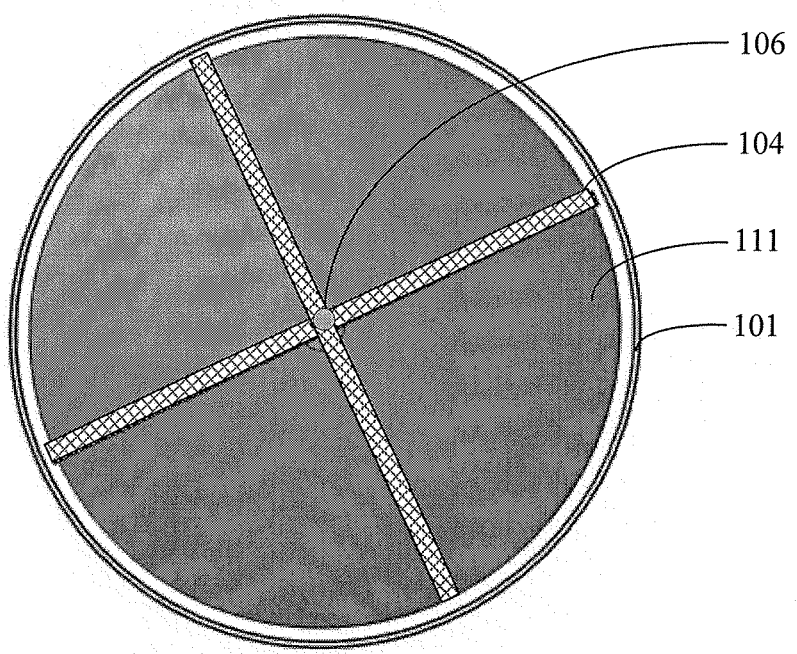
FIG. 5 is a schematic sectional top view of further another example embodiment of the heat dissipating device.

In the above example embodiment, there is only one evaporation portion scraping brush 104, but the device is not limited to this. In another example embodiment as shown in FIG. 5, there can be more than one evaporation portion scraping brush 104, and a plurality of evaporation portion scraping brushes 104 can be arranged equiangularly with the rotary shaft 106 as a center. In this case, the number of times that the same location of the inner surface of the evaporation portion 102 is swept by the evaporation portion scraping brush 104 after one revolution of the rotary shaft 106 is in direct proportion to the number of the evaporation portion scraping brushes 104.

In still another example embodiment, the rotary shaft 106 is disposed between the center of the evaporation portion scraping brush 104 and the edge of the same, that is, the distance from one end of the evaporation portion scraping brush 104 to the rotary shaft 106 is smaller than that from the other end to the rotary shaft 106. Such a structure enables the circular region which centers on the rotary shaft 106 and has a radius of the distance from the rotary shaft 106 to the nearest end of the evaporation portion scraping brush 104 to be swept twice by the evaporation portion scraping brush 104 after one revolution of the rotary shaft 106, while the remaining region will be swept only once by the evaporation portion scraping brush 104. When the central portion of the heat generating unit 120 emits a higher amount of heat than the edge, the above structure can be adopted to strengthen the heat dissipation of the center of the heat generating unit 120.

In the above example embodiment, to enable the evaporation portion scraping brush 104 to sweep across the inner surface of the evaporation portion 102 periodically, the rotary shaft 106 is used to selectively drive the evaporation portion scraping brush 104. But the device is not limited to this. It can be understood by those skilled in the art that sweeping across the inner surface of the evaporation portion 102 periodically by the evaporation portion scraping brush 104 can also be realized by a power device, for example, a linear motor, a planar motor, a linear hinge, etc., driving the evaporation portion scraping brush 104 to move back and forth linearly. In another example embodiment, more than two evaporation portion scraping brushes 104 are arranged in parallel to increase the sweeping frequency of the evaporation portion scraping brushes 104.

Figure 6:
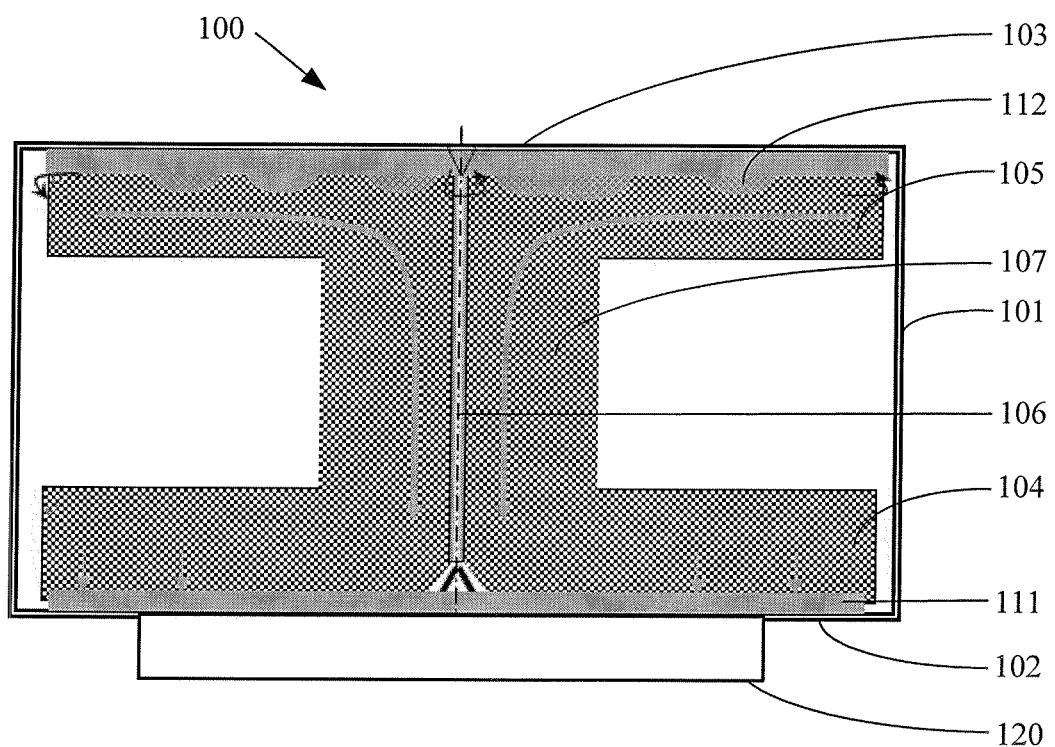
FIG. 6 is a schematic sectional front view of one example embodiment of the heat dissipating device.

As shown in FIG. 6, the chamber 101 can further include therein a condensation portion scraping brush 105. The condensation portion scraping brush 105 sweeps across the inner surface of the condensation portion 103 periodically. Under this sweeping motion, the condensation portion scraping brush 105 continuously collects the coagulated fluid refrigerant droplets 112 from the inner surface of the condensation portion 103. The refrigerant fluid droplets 112 are thus prevented from falling onto the inner surface of the evaporation portion 102 randomly after having accumulated to a sufficient weight to fluctuate the heat dissipating performance of the heat dissipating device 100.

The condensation portion scraping brush 105 can be of elongated profile, can be a single sector shape shown in FIG. 2a, a symmetrical sector shape shown in FIG. 2b, etc. The surface of the condensation portion scraping brush 105 which is opposed to the condensation portion 103 is in contact with the inner surface of the condensation portion 103. During the sweeping motion of the condensation portion scraping brush 105, the surface of the condensation portion scraping brush 105 is still in contact with the evaporation portion 102. Alternatively, the surface of the condensation portion scraping brush 105 which is opposed to the condensation portion 103 is kept a distance from the inner surface of the condensation portion 103. During the sweeping motion of the condensation portion scraping brush 105, the surface of the condensation portion scraping brush 105 is still kept a distance from the evaporation portion 102.

In one example embodiment, the method can be adopted wherein just as the condensation portion scraping brush 105 sweeps across the inner surface of the condensation portion 103 periodically, the evaporation portion scraping brush 104 may sweep across the evaporation portion. When the evaporation portion scraping brush 104 moves in a rotary manner as shown in FIG. 4, the condensation portion scraping brush 105 can also be mounted to the rotary shaft 106. The rotary shaft 106 drives the evaporation portion scraping brush 104 and the condensation portion scraping brush 105 to rotate together. In another example embodiment, there can be one condensation portion scraping brush 105, or a plurality of condensation portion scraping brushes 105 which are arranged equiangularly centering on the rotary shaft 106.

When the evaporation portion scraping brush 104 moves back and forth linearly, a connecting device such as a connecting rod can be used to connect the condensation portion scraping brush 105 with the power device that drives the evaporation portion scraping brush 104 to move, so that the condensation portion scraping brush 105 can also sweep across the inner surface of the condensation portion 103 periodically. In still another example embodiment, more than two condensation portion scraping brushes 105 are arranged in parallel to increase the sweeping frequency of condensation portion scraping brushes 105.

The condensation portion scraping brush 105 and the evaporation portion scraping brush 104 can be made from a porous material to enhance the fluid storing ability of the two scraping brushes, and to further improve the ability of the condensation portion scraping brush 105 to collect fluid refrigerant droplets 112 and the ability of the evaporation portion scraping brush 104 to apply refrigerant liquid film 111.

With reference to FIG. 6, the chamber 101 can include therein a fluid guiding bridge 107 made from a porous material. The fluid guiding bridge 107 connects the condensation portion scraping brush 105 with the evaporation portion scraping brush 104. Since the fluid guiding bridge 107 is made from a porous material, a number of capillary tube passages are formed inside the fluid guiding bridge 107, the fluid refrigerant collected by the condensation portion scraping brush 105 can arrive the evaporation portion scraping brush 104 through the capillary tube passages inside the fluid guiding bridge 107, to form a refrigerant capillary tube path from the condensation portion scraping brush 105 to the evaporation portion scraping brush 104, thus realizing the cyclic use of refrigerant and enabling the heat dissipating device 100 to work continuously.

In one example embodiment, the projection on the inner surface of the evaporation portion 102 of the contact area between the heat generating unit 120 and the outer surface of the evaporation portion 102 is the same as the inner surface region of the evaporation portion 102 swept by the evaporation portion scraping brush 104, or within the inner surface region. Local overheating of the heat generating unit 120 is thereby avoided.

In the above heat dissipating device, the refrigerant liquid film 111 is adsorbed to the inner surface of the evaporation portion 102 by the attractions between molecules; the refrigerant vapor arrives the inner surface of the condensation portion 103 by heat expansion and dispersion to coagulate; the fluid refrigerant arrives the evaporation portion scraping brush 104 from the condensation portion scraping brush 105 through the fluid guiding bridge 107 under capillary action. The above steps form the cycle of refrigerant. Hence, no gravity is involved during the operation of the heat dissipating device 100. Thus, the heat dissipating device and the heat dissipating method can be applied to a non-gravity environment, for example, a vacuum. In the case that the capillary tube passages inside the fluid guiding bridge 107 are small enough, the heat dissipating device 100 can be used where the device is positioned in an upright position, a side position and an inverted position.

Figure 7:
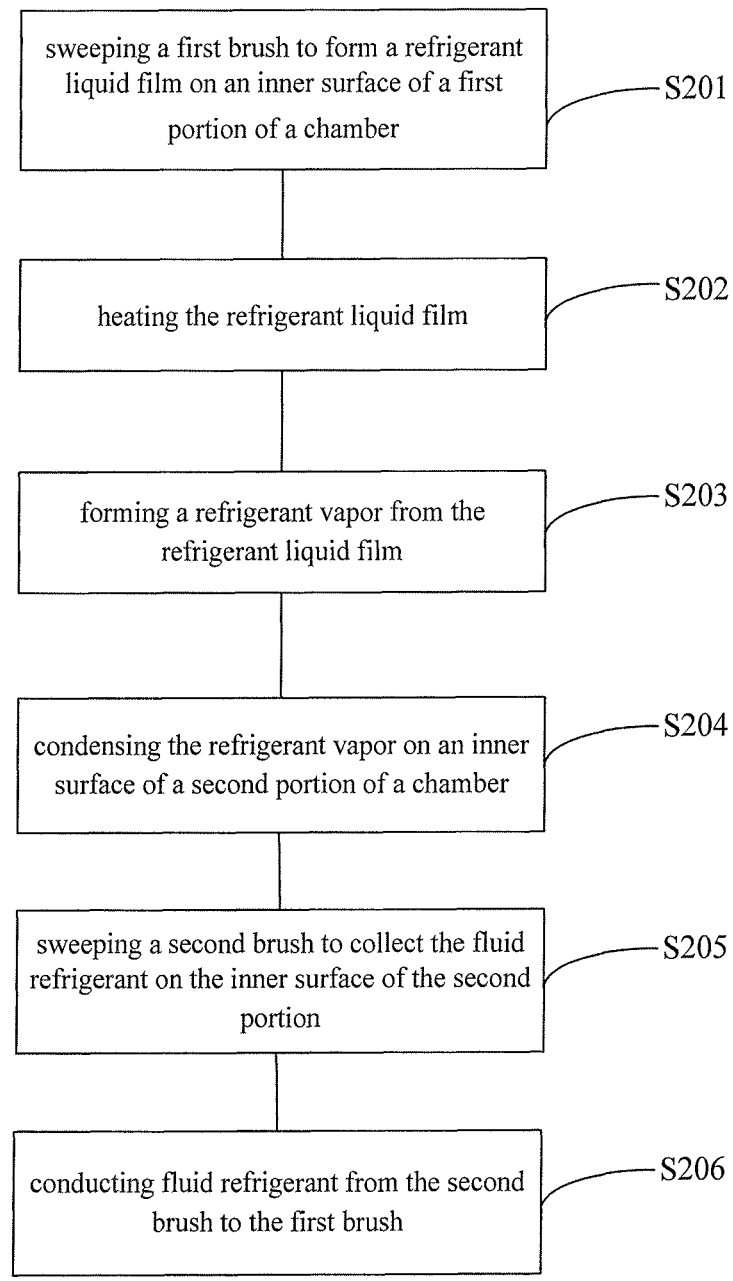
FIG. 7 is a flowchart of one example embodiment of the heat dissipating method.

The flowchart of an example embodiment of the heat dissipating method is shown in FIG. 7. The method includes, in step S201, sweeping a first brush to form a refrigerant liquid film on an inner surface of a first portion of a chamber. In step S202, the refrigerant liquid film is headed. In step S203, a refrigerant vapor is formed from the refrigerant liquid film.

In step S204, the refrigerant vapor condenses on an inner surface of a second portion of a chamber. In step S205, a second brush sweeps to collect the fluid refrigerant on the inner surface of the second portion. In step S206, fluid refrigerant is conducted from the second brush to the first brush.

In one example embodiment, the formation of the refrigerant liquid film is realized by sweeping across the inner surface of the evaporation portion by the evaporation portion scraping brush.

In another example embodiment, the motion of the evaporation portion scraping brush sweeping across the inner surface of the evaporation portion is periodic and therefore has a periodicity. The period is determined by equation (2).

The motion of sweeping across the inner surface of the evaporation portion by the evaporation portion scraping brush has a periodicity. In one example embodiment, the periodicity is realized by driving the evaporation portion scraping brush by the isolating member to rotate at a given speed through the rotary shaft.

In addition, the heat dissipating method may further include condensation portion scraping brush sweeping across the inner surface of the condensation portion to collect the fluid refrigerant on the inner surface of the condensation portion. In other example embodiments, sweeping across the inner surface of condensation portion by the condensation portion scraping brush is realized by driving the evaporation portion scraping brush and the condensation portion scraping brush by the isolating member to rotate at a given speed through the rotary shaft. Also, the rotational speed of the rotary shaft can be determined by equation (3).

In still another example embodiment, the fluid refrigerant reaches the evaporation portion scraping brush through a capillary tube path inside a fluid guiding bridge made from a porous material to form the cycling of refrigerant.

In the above heat dissipating device, the refrigerant liquid film is adsorbed to the inner surface of the evaporation portion by the attractions between molecules. The refrigerant vapor arrives the inner surface of the condensation portion by heat expansion and dispersion to coagulate. The fluid refrigerant arrives the evaporation portion scraping brush from the condensation portion scraping brush through the fluid guiding bridge under capillary action The above steps form the cycle of refrigerant. Hence, no gravity is involved during the operation of the heat dissipating device. Thus, the heat dissipating device and the heat dissipating method can be applied to a non-gravity environment, for example, in a vacuum. In the case that the capillary tube passages inside the fluid guiding bridge are small enough, the heat dissipating device can be formed in an upright position, a side position and an inverted position.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to disclosures containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A heat dissipating device, comprising:
a chamber having an evaporation portion and a condensation portion, wherein:
the evaporation portion is operable to have a refrigerant liquid film formed on an inner surface thereof, and the condensation portion is operable to have a refrigerant vapor condense on an inner surface thereof; and a first brush, positioned adjacent to the inner surface of the evaporation portion, configured to sweep the inner surface of the evaporation portion to form the refrigerant liquid film, wherein the first brush is configured to sweep periodically and a period is determined by the following equation:

$$t' = \frac{(\delta_0^2 - \delta'^2)\rho h_{fg}}{2\lambda \Delta T}$$

wherein, t' is the period, δo is the initial thickness of the liquid film, δ' is the evaporation final thickness of the liquid film, ρ is the density of the refrigerant, $h_{fg}$ is the potential energy of the refrigerant, λ is the heat conductivity of the refrigerant, ΔT is the superheat of the evaporation portion over the environment.

2. The heat dissipating device according to claim 1, further comprising:
a rotary shaft positioned within the chamber, wherein the first brush is affixed to an end of the rotary shaft that is adjacent to the evaporation portion.

3. The heat dissipating device according to claim 1, further comprising:
a second brush positioned adjacent to the inner surface of the condensation portion, wherein the second brush is configured to sweep the inner surface of the condensation portion.

4. The heat dissipating device according to claim 3, further comprising: a channel connecting the first brush with the second brush.

5. The heat dissipating device according to claim 3, further comprising:
a rotary shaft positioned within the chamber, wherein the first brush is affixed to an end of the rotary shaft that is adjacent to the evaporation portion, and the second brush is affixed to the other end of the rotary shaft that is adjacent to the condensation portion.

6. The heat dissipating device according to claim 1, wherein the first brush is driven by a rotary shaft rotating at a given speed.

7. The heat dissipating device according to claim 3, further comprising:
conducting fluid refrigerant from the second brush to the first brush.

8. The heat dissipating device according to claim 3, further comprising: the first brush and the second brush being driven by a rotary shaft rotating at a given speed.

9. The heat dissipating device according to claim 8, wherein the rotational speed of the rotary shaft is:

$$\omega = \frac{4\pi\lambda\Delta T}{(\delta_0^2 - \delta'^2)\rho h_{fg} N}$$

wherein, δo is the initial thickness of the liquid film, δ' is the evaporation final thickness of the liquid film, ρ is the density of the refrigerant, $h_{fg}$ is the potential energy of the refrigerant, λ is the heat conductivity of the refrigerant, ΔT is the superheat of the evaporation portion over the environment, N is the number of times that the same location of the inner surface of the evaporation portion is swept by the evaporation portion scraping brush after one revolution of the rotary shaft.

10. A heat dissipating device, comprising:
a chamber having an evaporation portion and a condensation portion, wherein: the evaporation portion is operable to have a refrigerant liquid film formed on an inner surface thereof, and the condensation portion is operable to have a refrigerant vapor condense on an inner surface thereof;
a first brush, positioned adjacent to the inner surface of the evaporation portion, configured to sweep the inner surface of the evaporation portion to form the refrigerant liquid film;
a second brush, positioned adjacent to the inner surface of the condensation portion, configured to sweep the inner surface of the condensation portion; and the first brush and the second brush being driven by a rotary shaft rotating at a given speed, wherein the rotational speed of the rotary shaft is:

$$\omega = \frac{4\pi\lambda\Delta T}{(\delta_0^2 - \delta'^2)\rho h_{fg} N}$$

wherein, δo is the initial thickness of the liquid film, δ' is the evaporation final thickness of the liquid film, ρ is the density of the refrigerant, $h_{fg}$ is the potential energy of the refrigerant, λ is the heat conductivity of the refrigerant, ΔT is the superheat of the evaporation portion over the environment, N is the number of times that the same location of the inner surface of the evaporation portion is swept by the evaporation portion scraping brush after one revolution of the rotary shaft.

* * * * *

UNITED STATES PATENT AND TRADEMARK OFFICE
CERTIFICATE OF CORRECTION

| | |
|---|---|
| PATENT NO. | : 8,944,150 B2 |
| APPLICATION NO. | : 12/535530 |
| DATED | : February 3, 2015 |
| INVENTOR(S) | : Wang |

It is certified that error appears in the above-identified patent and that said Letters Patent is hereby corrected as shown below:

On the Title Page, Item (54) and in the Specification, in Column 1, Line 1, Title, delete "DISSIPATION" and insert -- HEAT DISSIPATION --, therefor.

In the Specification

In Column 1, Line 5, delete "APPLICATION" and insert -- APPLICATIONS --, therefor.

In Column 1, Line 7, delete "The present" and insert -- The present Application claims priority from the Foreign Application No. CN 2008 1 0041372 filed on Aug. 4, 2008. The present --, therefor.

In Column 5, Line 32, delete "speed c" and insert -- speed ω --, therefor.

In Column 8, Line 26, delete "action The" and insert -- action. The --, therefor.

Signed and Sealed this
Twenty-first Day of July, 2015

Michelle K. Lee
*Director of the United States Patent and Trademark Office*